United States Patent [19]

Imamura et al.

[11] 4,412,264

[45] Oct. 25, 1983

[54] MAGNETO-OPTIC RECORDING MEDIUM

[75] Inventors: Nobutake Imamura, Tokyo; Chuichi Ota, Fuchu, both of Japan

[73] Assignee: Kokusai Denshin Denwa Co., Ltd., Tokyo, Japan

[21] Appl. No.: 197,805

[22] Filed: Oct. 17, 1980

[30] Foreign Application Priority Data

Oct. 22, 1979 [JP] Japan .................................. 54-135123
Oct. 22, 1979 [JP] Japan .................................. 54-135124

[51] Int. Cl.³ ........................ G11B 11/10; G11C 11/42
[52] U.S. Cl. ..................................... 360/131; 360/114
[58] Field of Search ................. 360/131, 114, 59, 116; 369/275

[56] References Cited

U.S. PATENT DOCUMENTS

| | | | |
|---|---|---|---|
| 3,167,751 | 1/1965 | Kelner et al. | 360/114 |
| 3,512,168 | 5/1970 | Bate | 360/59 |
| 3,643,233 | 2/1972 | Fan et al. | 360/114 |
| 3,676,867 | 7/1972 | Bacon et al. | 360/114 |
| 3,816,237 | 6/1976 | Barrall et al. | 360/131 |

OTHER PUBLICATIONS

IBM Tech. Disc. Bull., W. T. Frost et al., Thermomagnetic Recording and Erasure, vol. 15, No. 9, Feb. 1973, pp. 2747-2748.

Primary Examiner—Alfred H. Eddleman

[57] ABSTRACT

Disclosed is a magneto-optic recording medium to which magnetic Kerr effect is applied and characterized by the tracking guide on an even surface free from disorder of linear polarization. Since the tracking guide may be any type if it has a different reflection characteristic from that of the memory area viewing from magneto-optic standpoint, the tracking guide can be produced by a thermal treatment for changing the magnetic property of a part of a thin film with its magnetization easy axis in the direction perpendicular to the film surface. As no difference exists between the memory area and the guide area other than their magnetic properties, they are on the same plane and have no unevenness between their surfaces. Where, the guide area is assumed to have such magnetic property as the magnetization easy axis is parallel to the film surface, or it is perpendicular to the film surface but has no rectangular hysterisis. Such change of magnetic property can be obtained easily by an irradiation of laser beam to an amorphous alloy thin film with perpendicular magnetization easy axis.

6 Claims, 19 Drawing Figures

MAGNETO-OPTIC RECORDING MEDIUM

BACKGROUND OF THE INVENTION

This invention relates to a magneto-optic memory and more particularly to a magneto-optic recording medium provided with such construction as to facilitate the tracking of the light beam used on writing into and reading out of the medium.

DESCRIPTION OF THE PRIOR ART

For use in the recording medium available for the magneto-optic memory, such materials as MnBi, MnAlGe, GdFe, TbFe and GdCo are known. Usually, these materials are vacuum evaporated or spattered on a substrate of glass, silicon wafer or the like to form an amorphous alloy thin film for a magneto-optic recording medium. These magneto-optic recording media have the following common properties. (1) The magnetization easy axis is perpendicular to the film surface, (2) Curie temperature and magnetic compensation temperature are relatively low.

As the magnetization easy axis is in the direction perpendicular to the film surface as shown in FIG. 1, binary information "1" and "0" can be recorded using the upward magnetization 1 and the downward magnetization 2 of perpendicular magnetization of film 4 on the glass substrate 3, and therefore it is available as a digital memory. Methods of writing information are for example as follows. First of all, the entire film is magnetized downwardly, or it is set at "0". When information "1" is written in, a laser beam is irradiated on the part in which the record is made with a weak upward external magnetic field (direction "1"). As the part irradiated by a laser beam is put at a high temperature that will minimize the coersive force Hc, the direction of magnetization at that part is turned upward even by a weak external field, thereby information "1" being recorded. When information "0" is written in, the laser beam is not irradiated because the initial condition is "0". As the part non-subjected to irradiation of laser beam is held at a low temperature, or high coercive force Hc, an application of external magnetic field won't reverse the direction of magnetization, therefore maintaining the downward magnetization (information "0"). An example of recording pattern in this method is shown in FIG. 2, wherein the magnetic recording pattern consists of the parts 5 where information "1" is recorded in such manner as to irradiate a laser beam to turn the direction of magnetization, and the parts 6 where information "0" is recorded in such manner as to maintain the downward magnetization without laser beam irradiation.

In the above description, addresses are not taken into consideration in selection of the place in which recording is made, but in actual magneto-optic recording medium such as magneto-optic disk, a tracking guide is needed to address the laser beam at any desired place for high density recording. To realize a high density recording by addressing the laser beam without tracking guide, a high mechanical accuracy is required for the mechanism of determining the laser beam position, and the device is not practical in both manufacture and usage. Similarly, in reading, a tracking guide is also needed since a laser beam is used to utilize the Magnetic Kerr Effect.

In conventional apparatus, the laser beam generator was a large scale gas laser source which must be fixed at a location and therefore in directing the laser beam to a desired position the disk was required to have high rotation accuracy in realizing high density recording and reproducing. Owing to recent development of semiconductor laser device, the heads have been miniturized and made light in weight. This makes it possible to move the photo recording and reproducing head along with the tracking guide provided on the recording medium itself.

In case of optical memory, the tracking guide has already been employed as shown by the example of FIG. 3. In the optical memory, trasparence and opaque or reflection and non-reflection are related to the binary information. As shown in FIG. 3, unevenness 8 formed on the optical memory medium 7 can be used as the tracking guide, because the light reflection rate at concave part is different from that at convex part. In other words, detection of reflection rate of a light spot irradiated on the concave part makes it possible to move the photo recording and reproducing head along with the concave part. Thus, in case of optical memory, the recording and reproducing are realized by using a track—follow—type head if only the amount of light reflection (or light reflection rate) of recording track is different from that of non-recording track. Contrary, in the reading operation of magneto-optic memory, different from that in its reproducing operation, Magnetic Kerr Effect together with linear polarization is used, therefore the tracking guide of FIG. 3 can't be adopted. In other words, in the reading of magneto-optic memory, the amount of light used in very small and in addition the unevenness of the memory medium itself causes random radiation of light, disorder of linear polarization and noise that will disable the light detection.

SUMMARY OF THE INVENTION

It is an object of this invention to provide a magneto-optic recording medium with tracking guide that does not generate random reflection of light.

It is another object of this invention to provide a magneto-optic recording medium having fine tracking guide that will enable a high density recording.

These objects will be attained by a magneto-optic recording medium formed as a result of combining two sorts of areas side by side; the area having magnetization easy axis perpendicular to the film surface and the area without magnetization easy axis in the direction perpendicular to the film surface. The objects will also be attained by a magneto-optic recording medium comprising the area whose magnetization easy axis is perpendicular to the film surface and the area whose magnetization easy axis is also perpendicular to the film surface but the coercive force is different from that of the former area, both formed adjacently on the same plane.

BREIF DESCRIPTION OF THE DRAWINGS

DETAILED DESCRIPTION OF PREFERRED EMBODIMENT

Figure 1:
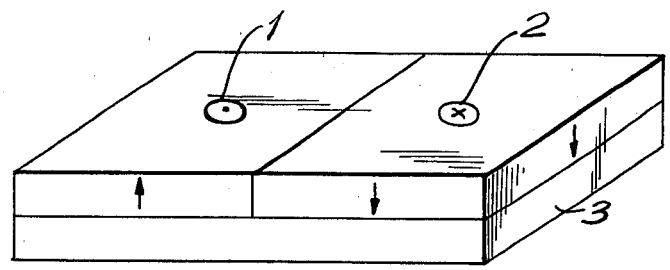
FIG. 1 is a drawing for use in the explanation of the principle of magneto-optic recording system.
Figure 2:
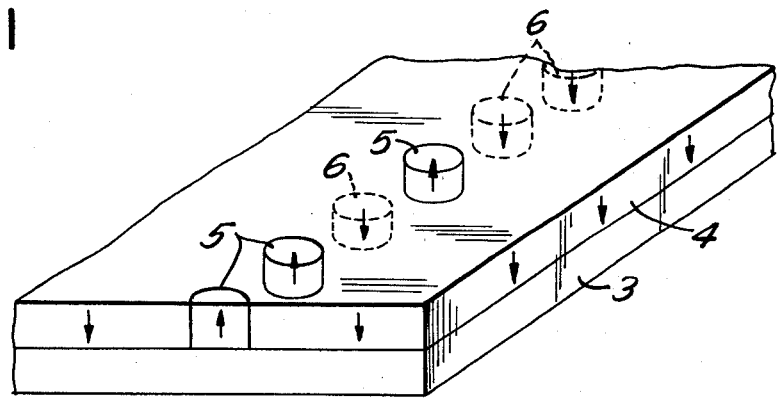
FIG. 2 shows an example of the magneto-optic recording pattern.

Referring to the drawings, this invention will be explained in detail in below.

Figure 3:
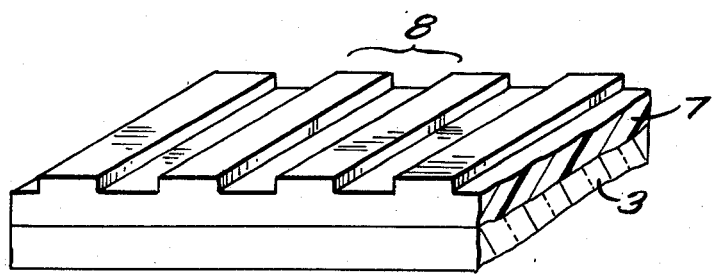
FIG. 3 shows an example of tracking guide in an optical memory medium.
Figure 4:
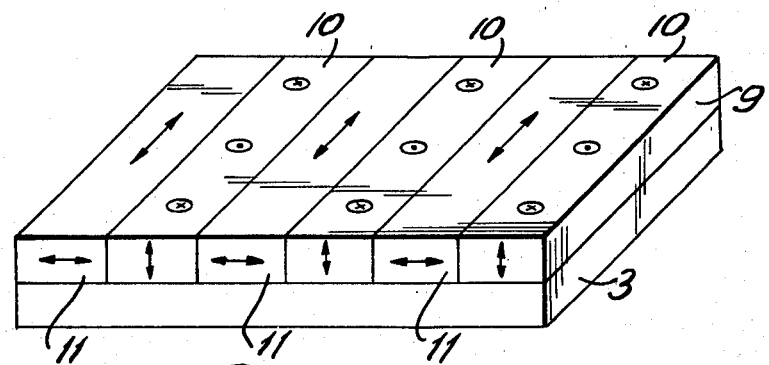
FIG. 4 shows an embodiment of this invention.

FIG. 4 shows an embodiment of this invention. In the figure, referrence number 3 denotes a substrate of such as glass on which is formed a thin film of magneto-optic recording medium 9 made of such materials as MnBi, MnAlGe, GdFe, TbFe, GdCo, etc. The magneto-optic recording medium 9 has amorphous state (non-crystalline) region 10 where the magnetization easy axis is in the direction perpendicular to the film surface and crystalline region 11 where the magnetization easy axis is parallel to the film surface, arranged alternatively on the same plane. As Magnetic Kerr Effect is utilized in the reading in magneto-optic recording, only the difference in amount of magneto-optic light detection between regions 10 and 11 will provides an optical guide equivalent to the tracking guide made by adding unevenness 8 to the optical memory medium 7 of FIG. 3.

Figure 5:
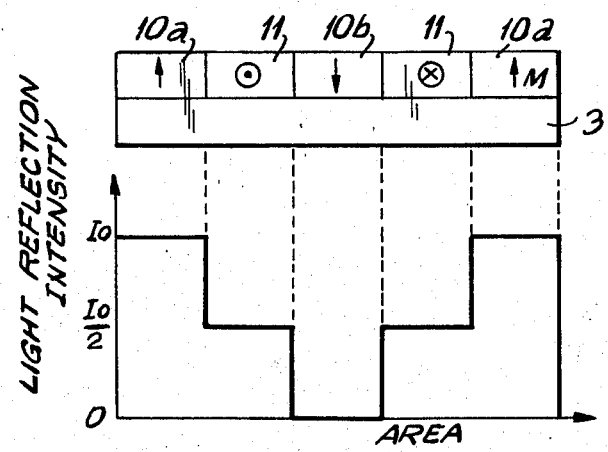
FIG. 5 shows a variety of detected light reflection intensities from each area of the magneto-optic recording medium.

In fact, in amorphous region 10 in which the magnetization easy axis is perpendicular to the film surface, the direction of magnetization is either upward or downward, and in the crystalline region 11 in which the magnetization easy axis is parallel to the film surface, the magnetization component perpendicular to the film surface is zero. The intensity of reflected light from each region due to Magnetic Kerr Effect, therefore, is varied as shown in FIG. 5, since the laser beam is applied perpendicularly to the film surface in case of photo-reading. In FIG. 5, if the magnetization M is perpendicular to the film surface, and the amount of reflected light from upward magnetization region 10a in amorphous region is Io, the amount of reflected light from downward magnetization region 10b is zero. The amount of light reflected from the crystalline region is Io/2, as the film has no perpendicular magnetization component. As the amount of reflected light (viewing from magneto-optic standpoint) in each of the regions 10a, 10b and 11 is different, the crystalline region 11 where the magnetization easy axis is parallel to the film is available as a tracking guide. As all regions are on the same plane, there is no random light reflection that might disorder the linear polarization of light.

Figure 6A:
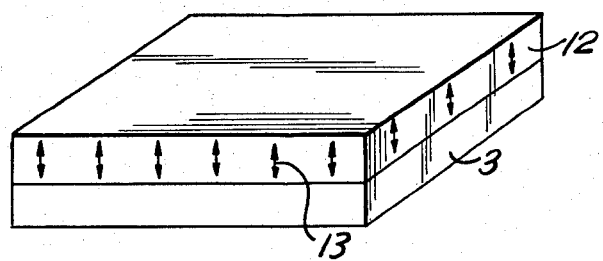
FIG. 6(a-b) shows a procedure of manufacturing the magneto-optic recording medium.
Figure 6B:
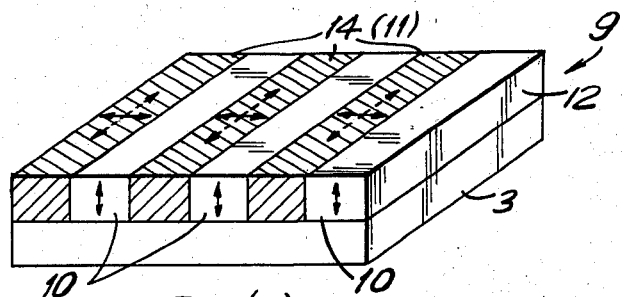

Such magneto-optic recording medium 9 consisting of amorphous region 10 and crystalline region 11 can be produced for example in the following manner. As shown in FIG. 6(a), firstly amorphous alloy film 12 of MnBi, MnAlGe, GdFe, TbFe, GdCo, etc. is formed on the substrate 3 by means of spattering, vacuum evaporation, etc. This amorphous alloy film 12 is a magnetic memory medium having magnetization easy axis 13 in perpendicular to the film plane. Next, a laser beam is applied on the amorphous film 12 to sweep the part 14 which is desired to be the tracking guide. The part 14 where the beam is applied is thermally treated. The amorphous film 12, when treated with the heat above near 400° C., escapes from the amorphous state and is crystalized. That is, the application of laser beam having power corresponding to above the crystalization temperature will crystalize the part 14 on which the beam is applied. The crystalization will eliminate the vertical magnetization easy axis if it is not single crystale, therefore the major cause of magnetic anisotropy is the shape anisotropy and the stable magnetization is parallel to the film surface. Namely, as shown in FIG. 6(b), the part 14 thermally treated by the laser beam forms a photo guide region 11 with its magnetization easy axis in parallel to the film surface. In contrast, the parts on which the laser beam is not applied, have the magnetization easy axis in perpendicular to the film surface, therefore forming magneto-optic recording regions 10. The magneto-optic recording medium 9 obtained by application of laser beam has the regions 10 and 11 on the same plane without any unevenness of surface since only the magnetization easy axis is changed by application of laser beam. That means, the detection of light can be made without random reflection. the polarized condition is maintained, and best suited for light detection of magnetization direction. The optical guide region 11 can be produced in any desired form by the sweeping of the laser beam, and a fine optical guide region 11 can be formed because of fineness of the laser beam. When the crystalization by the thermal treatment using laser beam is carried out in oxygen atmosphere, the the thermally treated parts are oxidized, and it is possible to eliminate the magnetization by means of a certain degree of oxidization. The part having no magnetization as a result of oxidation is also equivalent to the region 11 in which only the magnetization parallel to the film surface exists and no perpendicular component is involved as was described in above, and may be used as the photo guide region. The oxidized parts have usual light reflection rate different from that of the parts not oxidized, therefore this method can be applied to the photo guide for writing in and reading out by using the light which is not polarized.

Figure 7:
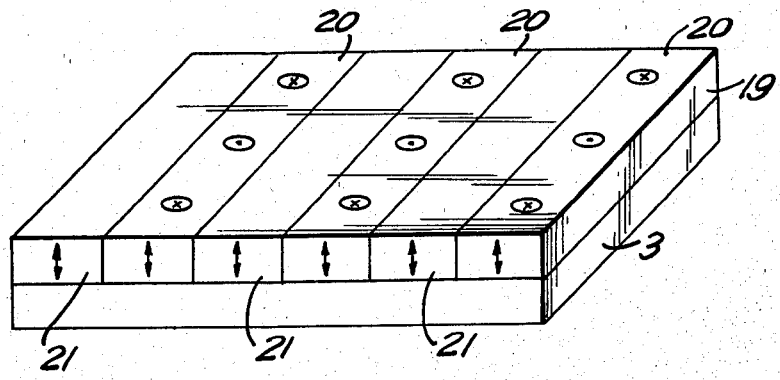
FIG. 7 shows another embodiment of this invention.
Figure 8A:
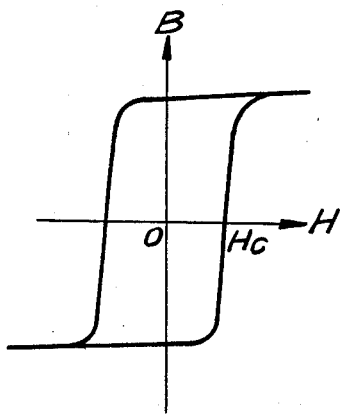
FIG. 8 is a graph indicating magnetic property of each area in the magneto-optic recording medium.
Figure 8B:
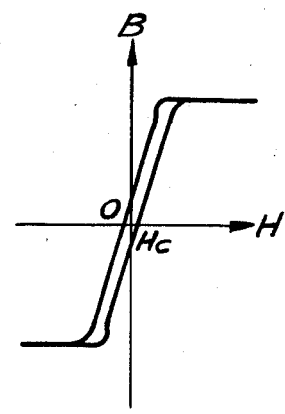

The expected values of laser power for use in the above mentioned laser manufacturing are as follows: laser powers of about 0 mW-20 mW are used in case of magneto-optic recording, but they are about 500 mW-1 W in crystalization. FIG. 7 shows another embodiment of this invention. In the figure, referrence number 3 denotes a substrate of such as glass on which thin film of magneto-optic recording medium 19 made of such materials as MnBi, MnAlGe, GdFe, TbFe, GdCo, etc. is formed. The magneto-optic recording medium 19 has a magnetization easy axis in the direction perpendicular to the film surface, and includes the regions 20 having a rectangular hysterisis loop with large coercive force Hc as shown in FIG. 8(a) and the regions 21 having an approximately no rectangular hysterisis loop with small coercive force as shown in FIG. 8(b), both arranged alternatively on the same plane. In the regions 20 having rectangular hysterisis loop, the direction of magnetization is perpendicular to the film surface and both upward and downward magnetizations are stable, therefore the downward and upward magnetizations may be related to the digital memory information "0" and "1". In contrast, in the regions 21 having small coercive force Hc, the rectangular hysterisis scarcely exists, and hence the mean value of the magnetization in the direction perpendicular to the film surface is zero.

Figure 9:
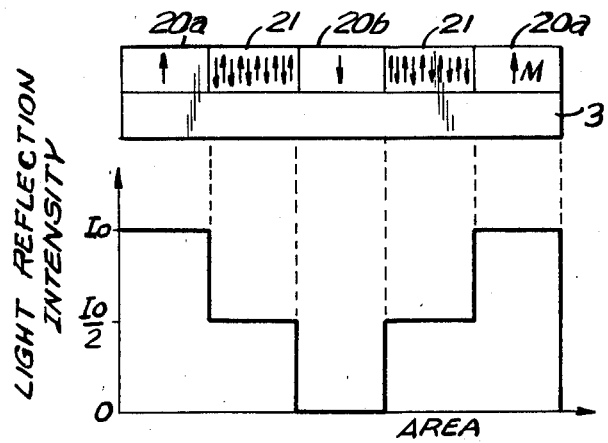
FIG. 9 shows a difference between the reflected light detection intensities from the respective areas on the magneto-optic recording medium.

That is, the amount of reflected light detected by a photo detector utilizing Magnetic Kerr Effect is in the middle value of information "0" and "1". FIG. 9 shows intensities of light reflections at respective regions due to magnetic Kerr Effect. Lets assume that a laser beam is applied to the magneto-optic recording medium 19 in the direction perpendicular to the film surface. If the magnetization M is pependicular to the film surface, the rectangular hysterisis region 20 has an upwardly magnetized region 20a from which a light Io is reflected and a downwardly magnetized region 20b from which no light is reflected. The regions 21 having no rectangular hysterisis characteristic have the reflected light Io/2, because the mean value of the magnetization perpendicular to the film surface is zero.

Figure 10A:
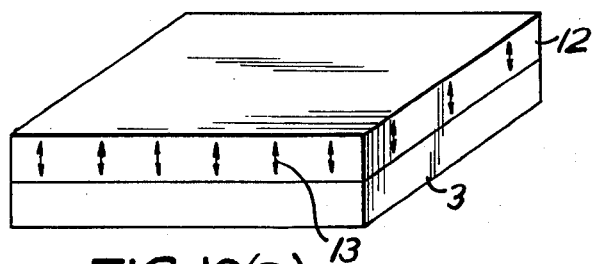
FIG. 10(a-b) shows a procedure for manufacturing the magneto-optic recording medium of FIG. 7.
Figure 10B:
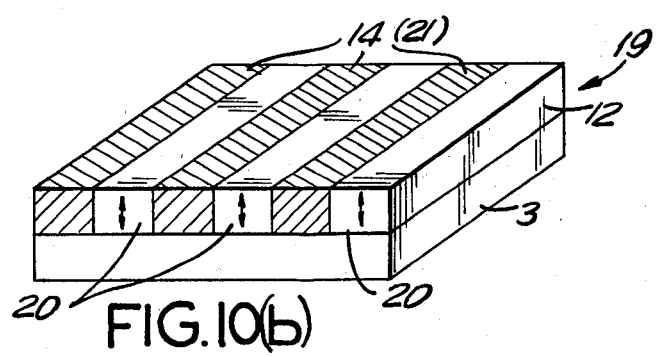
Figure 11A:
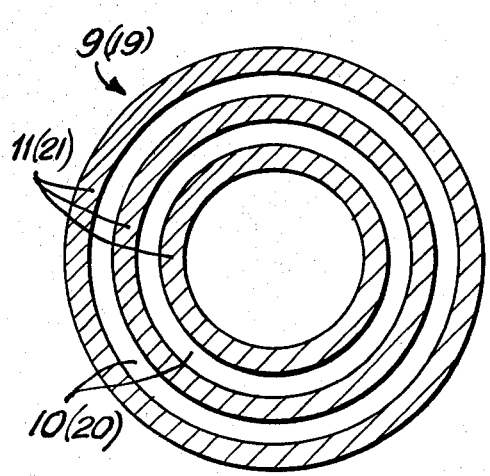
FIG. 11(a-g) shows some examples of area arrangements.
Figure 11B:
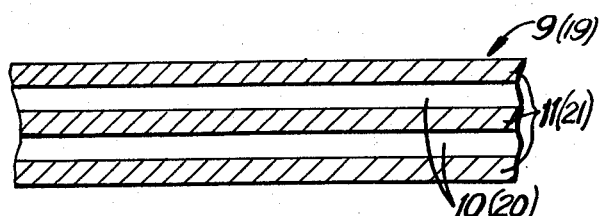
Figure 11C:
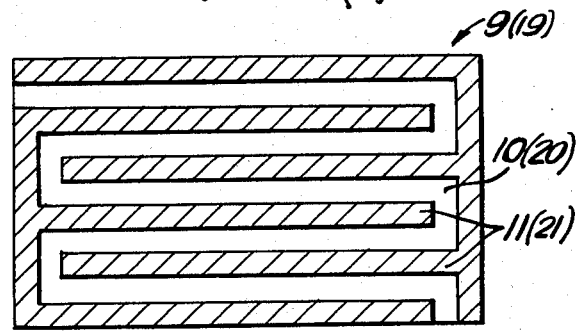
Figure 11D:
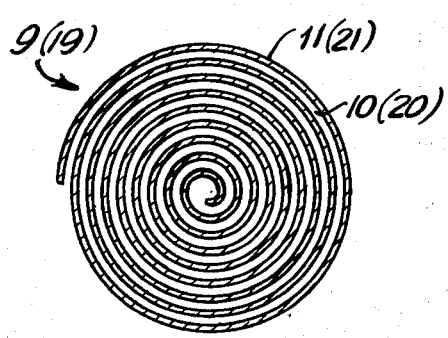
Figure 11E:
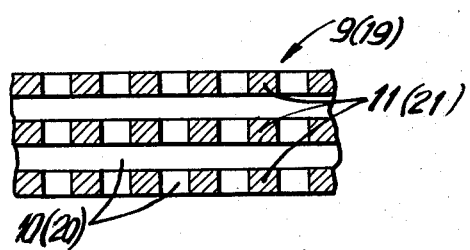
Figure 11F:
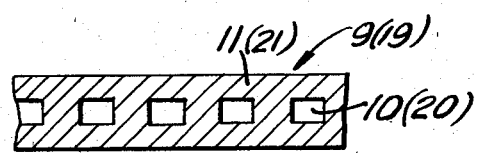
Figure 11G:
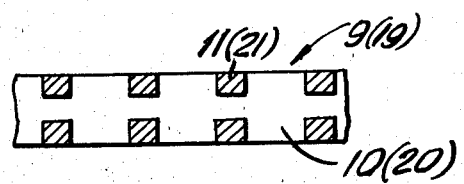

Thus, application of magnetic Kerr Effect to the reading of the magneto-optic recording medium introduces two regions 20 and 21 different in amount of light reflection viewed from magneto-optic standpoint, so that the regions 21 having apparent zero magnetization are used as the tracking guides. As these regions are defined only by the difference in magneto-optic reflection light quantity, they can be arranged on the same plane. Consequently no random reflection occurs and linear polarization is not disturbed. Such magneto-optic recording medium 19 consisting of regions 20 having rectangular hysterisis and regions 21 without it can be manufactured for example in the following manner. As shown in FIG. 10(a), on the substrate 3 an amorphous alloy film 12 made of such materials as MnBi, MnAlGe, GdFe, TbFe and GdCo is produced in such method as spattering and vacuum evaporation. Such amorphous alloy thin film 12, of course, has a magnetization easy axis 13 in the direction perpendicular to the film surface. Next, a laser beam is applied on the amorphous thin film 12 and the beam is swept on the parts 14 which are desired to form tracking guides as shown in FIG. 10(b). The amorphous thin film 12 will have thermally treated parts along with the irradiation loci 14 of the laser beam, and the thermally treated parts 14 will be changed in the magnetic property. In this case, with the laser beam power chosen, for example, to such extent as 50 mW–500 mW, the thermally treated parts 14 will have coercive force Hc so small as to show no rectangular hysterisis, and negligible residual magnetism. Therefore, as shown in FIG. 10(b), the shaded parts 14 on which laser beam is applied will have an apparent zero magnetization, forming tracking guides 21. In contrast, unshaded parts on which laser beam is not irradiated keep the magnetic property unchanged, forming the memory areas 20 which take two states, upward and downward magnetizations. Such magneto-optic recording medium 19 has areas 20 and 21 on the same plane and no difference of thickness because they are produced by changing only magnetic property by means of irradiation of laser beam. This means, no random reflection of light occurs so that the light detection can be performed with the polarization held unchanged, but suitable for the photo detection of magnetization direction. The tracking guide 21 can be produced in any desired form by the sweeping of the laser beam. The fineness of the laser beam makes it possible to manufacture a fine tracking guides 21 and hence to increase the memory density.

FIG. 11 shows some shapes of tracking guides. In each of the examples (a)–(g), the shaded parts represent memory areas 10 or 20 and the unshaded parts represent tracking guides 11 or 21, or vice versa. For example, the shaded parts may be used as memory areas 10 or 20. In FIG. 11, the example (a) is a disk type photo-magnetic memory with a circular substrate on which magneto-optic recording media 9 or 19 are formed, and around a central shaft the substrate rotates. The example (b) is a tape type magneto-optic recording memory in which the information is recorded in the longitudinal direction. The example (c) is a magneto-optic memory having a sheet type substrate on which photo-magnetic recording medium 9 or 19 are formed and the laser beam is swept on the plane. The example of (d) is a magneto-optic memory where the laser beam is swept spirally. The examples (e), (f) and (g) are magneto-optic memories in which two types of areas are arranged in lattice form. In both magneto-optic recording media 9 and 19, the reflected polarized light is measured by using magnetic Kerr Effect, therefore the photodetector can distinguish the memory areas (10, 20) from the guide areas (11, 21) with the difference of the light reflection though no unevenness exists on the surface. If the head operation is fed back in such way as to constantly supply a given amount of light to the photo detector, the head can be moved along the tracking guide (11, 21).

What is claimed is:

1. In a thin film magneto-optic recording medium on which two sorts of values are recorded by upward and downward magnetizations perpendicular to the film surface, the improvement wherein a tracking guide, which in use of said medium is followed by a magneto-optic recording/reproducing head, is defined on said medium by a region whose magnetization easy axis is perpendicular to the film surface and a region having no magnetization easy axis at least in the direction perpendicular to the film surface, said regions being located contiguously on the same surface.

2. In a thin film magneto-optic recording medium on which two sorts of values are recorded by upward and downward magnetizations perpendicular to the film surface, the improvement wherein a tracking guide, which in use of said medium is followed by a magneto-optic recording/reproducing head, is defined on said medium by a region whose magnetization easy axis is perpendicular to the film surface and a region which is the same in the direction of magnetization easy axis but different in the magnitude of the coercive force from that of the first-mentioned region, said regions being located contiguously on the same surface.

3. A magneto-optic recording medium according to claim 1, wherein the thin film region having the magnetization easy axis perpendicular to the film surface is of an alloy in an amorphous state, and the thin film region having no magnetization easy axis in the direction perpendicular to the film surface is of said alloy in a crystalline state.

4. A magneto-optic recording medium according to claim 2, wherein both regions are of an amorphous alloy, the coercive force of which can be decreased by a thermal treatment.

5. A magneto-optic recording medium according to claim 3, wherein said alloy is one which can be changed from said amorphous state to said crystalline state by thermal treatment done by a laser beam.

6. A magneto-optic recording medium according to claim 2, wherein both regions are of an amorphous alloy, the coercive force of which can be decreased by thermal treatment with a laser beam.

* * * * *